United States Patent
Bertness

(10) Patent No.: US 7,710,119 B2
(45) Date of Patent: May 4, 2010

(54) BATTERY TESTER THAT CALCULATES ITS OWN REFERENCE VALUES

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 519 days.

(21) Appl. No.: 11/304,004

(22) Filed: Dec. 14, 2005

(65) Prior Publication Data

US 2006/0125483 A1    Jun. 15, 2006

Related U.S. Application Data

(63) Continuation-in-part of application No. 11/008,456, filed on Dec. 9, 2004, now Pat. No. 7,545,146.

(60) Provisional application No. 60/636,270, filed on Dec. 14, 2004.

(51) Int. Cl.
G01N 27/416 (2006.01)

(52) U.S. Cl. .................. 324/426; 324/427; 320/132

(58) Field of Classification Search .............. 320/132; 324/426–427
See application file for complete search history.

(56) References Cited

U.S. PATENT DOCUMENTS

| | | | |
|---|---|---|---|
| 2,000,665 A | 5/1935 | Neal | 439/440 |
| 2,417,940 A | 3/1947 | Lehman | 200/61.25 |
| 2,514,745 A | 7/1950 | Dalzell | 324/115 |
| 2,727,221 A | 12/1955 | Springg | 340/447 |
| 3,178,686 A | 4/1965 | Mills | 340/447 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |

(Continued)

FOREIGN PATENT DOCUMENTS

DE    29 26 716 B1    1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—Edward Tso
*Assistant Examiner*—Samuel Berhanu
(74) *Attorney, Agent, or Firm*—Alan G. Rego; Westman, Champlin & Kelly, P.A.

(57) ABSTRACT

A battery tester that is capable of calculating its own reference values is provided. The battery tester includes test circuitry that is configured to obtain dynamic parameter values for batteries, and to compute at least one reference value based on the dynamic parameter values.

9 Claims, 4 Drawing Sheets

U.S. PATENT DOCUMENTS

| | | | |
|---|---|---|---|
| 3,808,522 A | 4/1974 | Sharaf | 324/430 |
| 3,811,089 A | 5/1974 | Strezelewicz | 324/170 |
| 3,816,805 A | 6/1974 | Terry | 320/123 |
| 3,850,490 A | 11/1974 | Zehr | 339/255 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,442 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 339/33 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koenck | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |

| Patent No. | Date | Inventor | Class |
|---|---|---|---|
| 5,266,880 A | 11/1993 | Newland | 320/125 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,387,871 A | 2/1995 | Tsai | 324/429 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 29/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,717,336 A | 2/1998 | Basell et al. | 324/430 |
| 5,717,937 A | 2/1998 | Fritz | 713/300 |
| 5,732,074 A | 3/1998 | Spaur et al. | 370/313 |
| 5,739,667 A | 4/1998 | Matsuda et al. | 320/128 |
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,951,229 A | 9/1999 | Hammerslag | 414/398 |
| 5,955,951 A | 9/1999 | Wischerop et al. | 340/572.8 |
| 5,961,561 A | 10/1999 | Wakefield, II | 701/29 |

| | | | |
|---|---|---|---|
| 5,961,604 A | 10/1999 | Anderson et al. .............. 709/229 |
| 5,969,625 A | 10/1999 | Russo ...................... 340/636.19 |
| 5,973,598 A | 10/1999 | Beigel ........................ 340/572.1 |
| 5,978,805 A | 11/1999 | Carson ............................ 707/10 |
| 5,982,138 A | 11/1999 | Krieger ........................ 320/105 |
| 6,002,238 A | 12/1999 | Champlin ..................... 320/134 |
| 6,005,489 A | 12/1999 | Siegle et al. ............. 340/825.69 |
| 6,005,759 A | 12/1999 | Hart et al. ....................... 361/66 |
| 6,008,652 A | 12/1999 | Theofanopoulos et al. ... 324/434 |
| 6,009,369 A | 12/1999 | Boisvert et al. ................. 701/99 |
| 6,016,047 A | 1/2000 | Notten et al. .................. 320/137 |
| 6,031,354 A | 2/2000 | Wiley et al. ................... 320/116 |
| 6,031,368 A | 2/2000 | Klippel et al. ................. 324/133 |
| 6,037,745 A | 3/2000 | Koike et al. ................... 320/104 |
| 6,037,749 A | 3/2000 | Parsonage ..................... 320/132 |
| 6,037,751 A | 3/2000 | Klang ........................... 320/160 |
| 6,037,777 A | 3/2000 | Champlin ..................... 324/430 |
| 6,037,778 A | 3/2000 | Makhija ........................ 324/433 |
| 6,046,514 A | 4/2000 | Rouillard et al. ................ 307/77 |
| 6,051,976 A | 4/2000 | Bertness ....................... 324/426 |
| 6,055,468 A | 4/2000 | Kaman et al. ................... 701/29 |
| 6,061,638 A | 5/2000 | Joyce ............................. 702/63 |
| 6,064,372 A | 5/2000 | Kahkoska ..................... 345/173 |
| 6,072,299 A | 6/2000 | Kurle et al. ................... 320/112 |
| 6,072,300 A | 6/2000 | Tsuji ............................. 320/116 |
| 6,081,098 A | 6/2000 | Bertness et al. .............. 320/134 |
| 6,081,109 A | 6/2000 | Seymour et al. ............. 324/127 |
| 6,087,815 A | 7/2000 | Pfeifer et al. ................. 323/282 |
| 6,091,238 A | 7/2000 | McDermott ................ 324/207.2 |
| 6,091,245 A | 7/2000 | Bertness ....................... 324/426 |
| 6,094,033 A | 7/2000 | Ding et al. ................... 320/132 |
| 6,100,670 A | 8/2000 | Levesque ...................... 320/150 |
| 6,104,167 A | 8/2000 | Bertness et al. .............. 320/132 |
| 6,113,262 A | 9/2000 | Purola et al. .................... 374/45 |
| 6,114,834 A | 9/2000 | Parise ........................... 320/109 |
| 6,137,269 A | 10/2000 | Champlin ..................... 320/150 |
| 6,140,797 A | 10/2000 | Dunn ............................ 320/105 |
| 6,144,185 A | 11/2000 | Dougherty et al. ........... 320/132 |
| 6,147,598 A | 11/2000 | Murphy et al. ........... 340/426.19 |
| 6,150,793 A | 11/2000 | Lesesky et al. ............... 320/104 |
| 6,158,000 A | 12/2000 | Collins ............................ 713/1 |
| 6,161,640 A | 12/2000 | Yamaguchi ................. 180/65.8 |
| 6,163,156 A | 12/2000 | Bertness ....................... 324/426 |
| 6,164,063 A | 12/2000 | Mendler ........................ 60/274 |
| 6,167,349 A | 12/2000 | Alvarez ........................ 702/63 |
| 6,172,483 B1 | 1/2001 | Champlin ..................... 320/134 |
| 6,172,505 B1 | 1/2001 | Bertness ....................... 324/430 |
| 6,177,737 B1 | 1/2001 | Palfey et al. ................... 307/64 |
| 6,181,545 B1 | 1/2001 | Amatucci et al. ............ 361/502 |
| 6,211,651 B1 | 4/2001 | Nemoto ........................ 320/133 |
| 6,215,275 B1 | 4/2001 | Bean ............................. 320/106 |
| 6,218,936 B1 | 4/2001 | Imao ............................ 340/447 |
| 6,222,342 B1 | 4/2001 | Eggert et al. ................. 320/105 |
| 6,222,369 B1 | 4/2001 | Champlin ..................... 324/430 |
| D442,503 S | 5/2001 | Lundbeck et al. ............. D10/77 |
| 6,225,808 B1 | 5/2001 | Varghese et al. ............. 324/426 |
| 6,236,332 B1 | 5/2001 | Conkright et al. ............. 340/3.1 |
| 6,238,253 B1 | 5/2001 | Qualls ......................... 439/759 |
| 6,242,887 B1 | 6/2001 | Burke ........................... 320/104 |
| 6,249,124 B1 | 6/2001 | Bertness ....................... 324/426 |
| 6,250,973 B1 | 6/2001 | Lowery et al. ............... 439/763 |
| 6,254,438 B1 | 7/2001 | Gaunt .......................... 439/755 |
| 6,259,170 B1 | 7/2001 | Limoge et al. ............. 307/10.8 |
| 6,259,254 B1 | 7/2001 | Klang ........................... 324/427 |
| 6,262,563 B1 | 7/2001 | Champlin ..................... 320/134 |
| 6,263,268 B1 | 7/2001 | Nathanson ...................... 701/29 |
| 6,271,643 B1 | 8/2001 | Becker et al. ................. 320/112 |
| 6,271,748 B1 | 8/2001 | Derbyshire et al. .......... 340/442 |
| 6,275,008 B1 | 8/2001 | Arai et al. .................... 320/132 |
| 6,294,896 B1 | 9/2001 | Champlin ..................... 320/134 |
| 6,294,897 B1 | 9/2001 | Champlin ..................... 320/153 |
| 6,304,087 B1 | 10/2001 | Bertness ....................... 324/426 |
| 6,307,349 B1 | 10/2001 | Koenck et al. ............... 320/112 |
| 6,310,481 B2 | 10/2001 | Bertness ....................... 324/430 |
| 6,313,607 B1 | 11/2001 | Champlin ..................... 320/132 |
| 6,313,608 B1 | 11/2001 | Varghese et al. ............. 320/132 |
| 6,316,914 B1 | 11/2001 | Bertness ....................... 320/134 |
| 6,320,351 B1 | 11/2001 | Ng et al. ....................... 320/104 |
| 6,323,650 B1 | 11/2001 | Bertness et al. .............. 324/426 |
| 6,329,793 B1 | 12/2001 | Bertness et al. .............. 320/132 |
| 6,331,762 B1 | 12/2001 | Bertness ....................... 320/134 |
| 6,332,113 B1 * | 12/2001 | Bertness ......................... 702/63 |
| 6,346,795 B2 | 2/2002 | Haraguchi et al. ........... 320/136 |
| 6,347,958 B1 | 2/2002 | Tsai ............................. 439/488 |
| 6,351,102 B1 | 2/2002 | Troy ............................. 320/139 |
| 6,356,042 B1 | 3/2002 | Kahlon et al. ................ 318/138 |
| 6,359,441 B1 | 3/2002 | Bertness ....................... 324/426 |
| 6,359,442 B1 | 3/2002 | Henningson et al. ......... 324/426 |
| 6,363,303 B1 | 3/2002 | Bertness ........................ 701/29 |
| RE37,677 E | 4/2002 | Irie ............................... 315/83 |
| 6,377,031 B1 | 4/2002 | Karuppana et al. ........... 323/220 |
| 6,384,608 B1 | 5/2002 | Namaky ....................... 324/430 |
| 6,388,448 B1 | 5/2002 | Cervas .......................... 324/426 |
| 6,392,414 B2 | 5/2002 | Bertness ....................... 324/429 |
| 6,396,278 B1 | 5/2002 | Makhija ........................ 324/402 |
| 6,407,554 B1 | 6/2002 | Godau et al. ................. 324/503 |
| 6,411,098 B1 | 6/2002 | Laletin ......................... 324/436 |
| 6,417,669 B1 | 7/2002 | Champlin ..................... 324/426 |
| 6,420,852 B1 | 7/2002 | Sato ............................. 320/134 |
| 6,424,157 B1 | 7/2002 | Gollomp et al. .............. 324/430 |
| 6,424,158 B2 | 7/2002 | Klang ........................... 324/433 |
| 6,437,957 B1 | 8/2002 | Karuppana et al. ............. 361/78 |
| 6,441,585 B1 | 8/2002 | Bertness ....................... 320/132 |
| 6,445,158 B1 | 9/2002 | Bertness et al. .............. 320/104 |
| 6,449,726 B1 | 9/2002 | Smith ........................... 713/340 |
| 6,456,036 B1 | 9/2002 | Thandiwe .................... 320/106 |
| 6,456,045 B1 | 9/2002 | Troy et al. .................... 320/139 |
| 6,465,908 B1 | 10/2002 | Karuppana et al. ............. 307/31 |
| 6,466,025 B1 | 10/2002 | Klang ........................... 324/429 |
| 6,466,026 B1 | 10/2002 | Champlin ..................... 324/430 |
| 6,469,511 B1 | 10/2002 | Vonderhaar et al. .......... 324/425 |
| 6,477,478 B1 | 11/2002 | Jones et al. ................... 702/102 |
| 6,495,990 B2 | 12/2002 | Champlin ..................... 320/132 |
| 6,497,209 B1 | 12/2002 | Karuppana et al. ........ 123/179.3 |
| 6,500,025 B1 | 12/2002 | Moenkhaus et al. .......... 439/502 |
| 6,505,507 B1 | 1/2003 | Imao et al. .................. 73/146.5 |
| 6,507,196 B2 | 1/2003 | Thomsen et al. ............. 324/436 |
| 6,526,361 B1 | 2/2003 | Jones et al. .................... 702/63 |
| 6,529,723 B1 | 3/2003 | Bentley ........................ 455/405 |
| 6,531,848 B1 | 3/2003 | Chitsazan et al. ............ 320/153 |
| 6,532,425 B1 | 3/2003 | Boost et al. .................... 702/63 |
| 6,534,992 B2 | 3/2003 | Meissner et al. ............. 324/426 |
| 6,534,993 B2 | 3/2003 | Bertness ....................... 324/433 |
| 6,536,536 B1 | 3/2003 | Gass et al. ....................... 173/2 |
| 6,544,078 B2 | 4/2003 | Palmisano et al. ........... 439/762 |
| 6,545,599 B2 | 4/2003 | Derbyshire et al. .......... 340/442 |
| 6,556,019 B2 | 4/2003 | Bertness ....................... 324/426 |
| 6,566,883 B1 | 5/2003 | Vonderhaar et al. .......... 324/426 |
| 6,570,385 B1 | 5/2003 | Roberts et al. ............... 324/378 |
| 6,577,107 B2 | 6/2003 | Kechmire ..................... 320/139 |
| 6,586,941 B2 | 7/2003 | Bertness et al. .............. 324/426 |
| 6,597,150 B1 | 7/2003 | Bertness et al. .............. 320/104 |
| 6,599,243 B2 | 7/2003 | Woltermann et al. ........ 600/300 |
| 6,600,815 B1 | 7/2003 | Walding .................... 379/93.07 |
| 6,611,740 B2 | 8/2003 | Lowrey et al. ................. 701/29 |
| 6,614,349 B1 | 9/2003 | Proctor et al. ............. 340/572.1 |
| 6,618,644 B2 | 9/2003 | Bean ............................ 700/231 |
| 6,621,272 B2 | 9/2003 | Champlin ..................... 324/426 |
| 6,623,314 B1 | 9/2003 | Cox et al. ..................... 439/759 |
| 6,624,635 B1 | 9/2003 | Lui ............................... 324/426 |
| 6,628,011 B2 | 9/2003 | Droppo et al. .................. 307/43 |
| 6,629,054 B2 | 9/2003 | Makhija et al. .............. 702/113 |
| 6,633,165 B2 | 10/2003 | Bertness ....................... 324/426 |
| 6,635,974 B1 | 10/2003 | Karuppana et al. ........... 307/140 |
| 6,667,624 B1 | 12/2003 | Raichle et al. ............... 324/522 |
| 6,679,212 B2 | 1/2004 | Kelling ..................... 123/179.28 |

| | | | | | | |
|---|---|---|---|---|---|---|
| 6,686,542 B2 | 2/2004 | Zhang ................... 174/74 | 2003/0088375 A1 | 5/2003 | Bertness et al. .............. 702/63 |
| 6,696,819 B2 | 2/2004 | Bertness ................ 320/134 | 2003/0137277 A1* | 7/2003 | Mori et al. ................. 320/132 |
| 6,707,303 B2 | 3/2004 | Bertness et al. .......... 324/426 | 2003/0169018 A1 | 9/2003 | Berels et al. ............... 320/132 |
| 6,736,941 B2 | 5/2004 | Oku et al. .................. 203/68 | 2003/0184262 A1 | 10/2003 | Makhija ................... 320/156 |
| 6,737,831 B2 | 5/2004 | Champlin ................ 320/132 | 2003/0184306 A1 | 10/2003 | Bertness et al. .......... 324/426 |
| 6,738,697 B2 | 5/2004 | Breed ...................... 701/29 | 2003/0187556 A1 | 10/2003 | Suzuki ...................... 701/29 |
| 6,740,990 B2 | 5/2004 | Tozuka et al. ............ 307/9.1 | 2003/0194672 A1 | 10/2003 | Roberts et al. ............. 431/196 |
| 6,745,153 B2 | 6/2004 | White et al. .............. 702/184 | 2003/0214395 A1 | 11/2003 | Flowerday et al. .......... 340/445 |
| 7,744,149 | 6/2004 | Karuppana et al. ........ 307/31 | 2004/0000590 A1 | 1/2004 | Raichle et al. .......... 235/462.01 |
| 6,759,849 B2 | 7/2004 | Bertness ................. 324/426 | 2004/0000891 A1 | 1/2004 | Raichle et al. ............. 320/107 |
| 6,777,945 B2 | 8/2004 | Roberts et al. ............ 324/426 | 2004/0000893 A1 | 1/2004 | Raichle et al. ............. 320/135 |
| 6,781,382 B2 | 8/2004 | Johnson ................... 324/426 | 2004/0002824 A1 | 1/2004 | Raichle et al. .............. 702/63 |
| 6,784,635 B2 | 8/2004 | Larson ..................... 320/104 | 2004/0002825 A1 | 1/2004 | Raichle et al. .............. 702/63 |
| 6,784,637 B2 | 8/2004 | Raichle et al. ............. 320/107 | 2004/0002836 A1 | 1/2004 | Raichle et al. ............. 702/188 |
| 6,788,025 B2 | 9/2004 | Bertness et al. ............ 320/104 | 2004/0032264 A1 | 2/2004 | Schoch ..................... 324/426 |
| 6,795,782 B2 | 9/2004 | Bertness et al. .............. 702/63 | 2004/0044452 A1 | 3/2004 | Bauer et al. ................ 703/33 |
| 6,796,841 B1 | 9/2004 | Cheng et al. ............. 439/620.3 | 2004/0049361 A1 | 3/2004 | Hamdan et al. ............ 702/115 |
| 6,805,090 B2 | 10/2004 | Bertness et al. ............. 123/198 | 2004/0051533 A1 | 3/2004 | Namaky ................... 324/426 |
| 6,806,716 B2 | 10/2004 | Bertness et al. ............ 324/426 | 2004/0054503 A1 | 3/2004 | Namaky ................... 702/182 |
| 6,825,669 B2 | 11/2004 | Raichle et al. ............ 324/426 | 2004/0113588 A1 | 6/2004 | Mikuriya et al. ............ 320/128 |
| 6,842,707 B2 | 1/2005 | Raichle et al. .............. 702/62 | 2004/0145342 A1 | 7/2004 | Lyon ........................ 320/108 |
| 6,845,279 B1 | 1/2005 | Gilmore et al. ............ 700/115 | 2004/0199343 A1 | 10/2004 | Cardinal et al. .............. 702/63 |
| 6,850,037 B2 | 2/2005 | Bertness .................. 320/132 | 2004/0227523 A1 | 11/2004 | Namaky ................... 324/537 |
| 6,871,151 B2 | 3/2005 | Bertness .................... 702/63 | 2004/0239332 A1 | 12/2004 | Mackel et al. ............. 324/426 |
| 6,885,195 B2 | 4/2005 | Bertness .................. 324/426 | 2005/0017726 A1 | 1/2005 | Koran et al. ................ 324/433 |
| 6,888,468 B2 | 5/2005 | Bertness ................ 340/636.15 | 2005/0025299 A1 | 2/2005 | Tischer et al. .............. 379/199 |
| 6,891,378 B2 | 5/2005 | Bertness et al. ............ 324/426 | 2005/0043868 A1 | 2/2005 | Mitcham ..................... 701/29 |
| 6,904,796 B2 | 6/2005 | Pacsai et al. .............. 73/146.8 | 2005/0057256 A1 | 3/2005 | Bertness ................... 324/426 |
| 6,906,522 B2 | 6/2005 | Bertness et al. ............ 324/426 | 2005/0102073 A1 | 5/2005 | Ingram ...................... 701/29 |
| 6,906,523 B2 | 6/2005 | Bertness et al. ............ 324/426 | 2005/0182536 A1 | 8/2005 | Doyle et al. ................. 701/29 |
| 6,906,624 B2 | 6/2005 | McClelland et al. ........ 340/442 | 2005/0254106 A9 | 11/2005 | Silverbrook et al. ........ 358/539 |
| 6,909,287 B2 | 6/2005 | Bertness ................... 324/427 | 2005/0256617 A1 | 11/2005 | Cawthorne et al. ........... 701/22 |
| 6,909,356 B2 | 6/2005 | Brown et al. ................ 340/3.2 | 2006/0030980 A1 | 2/2006 | St. Denis ..................... 701/29 |
| 6,913,483 B2 | 7/2005 | Restaino et al. ............. 439/504 | 2006/0089767 A1 | 4/2006 | Sowa ........................ 701/29 |
| 6,914,413 B2 | 7/2005 | Bertness et al. ............ 320/104 | 2006/0217914 A1 | 9/2006 | Bertness ................... 702/113 |
| 6,919,725 B2 | 7/2005 | Bertness et al. ............ 324/433 | 2006/0282323 A1 | 12/2006 | Walker et al. ................ 705/14 |
| 6,930,485 B2 | 8/2005 | Bertness et al. ............ 324/426 | 2007/0026916 A1 | 2/2007 | Juds et al. ..................... 463/1 |
| 6,933,727 B2 | 8/2005 | Bertness et al. ............ 324/426 | | | |
| 6,941,234 B2 | 9/2005 | Bertness et al. .............. 702/63 | | | |
| 6,967,484 B2 | 11/2005 | Bertness ................... 324/426 | | FOREIGN PATENT DOCUMENTS | |
| 6,972,662 B1 | 12/2005 | Ohkawa et al. ............. 340/10.1 | DE | 196 38 324 | 9/1996 |
| 6,998,847 B2 | 2/2006 | Bertness et al. ............ 324/426 | EP | 0 022 450 A1 | 1/1981 |
| 7,003,410 B2 | 2/2006 | Bertness et al. .............. 702/63 | EP | 0 637 754 A1 | 2/1995 |
| 7,003,411 B2 | 2/2006 | Bertness .................... 702/63 | EP | 0 772 056 A1 | 5/1997 |
| 7,012,433 B2 | 3/2006 | Smith et al. ................ 324/426 | EP | 0 982 159 A2 | 3/2000 |
| 7,058,525 B2 | 6/2006 | Bertness et al. .............. 702/63 | FR | 2 749 397 | 12/1997 |
| 7,081,755 B2 | 7/2006 | Klang et al. ............... 324/426 | GB | 2 029 586 | 3/1980 |
| 7,106,070 B2 | 9/2006 | Bertness et al. ............ 324/538 | GB | 2 088 159 A | 6/1982 |
| 7,116,109 B2 | 10/2006 | Klang ....................... 324/426 | GB | 2 246 916 A | 10/1990 |
| 7,119,686 B2 | 10/2006 | Bertness et al. .......... 340/572.1 | GB | 2 275 783 A | 7/1994 |
| 7,120,488 B2 | 10/2006 | Nova et al. .................... 600/2 | GB | 2 387 235 A | 10/2003 |
| 7,126,341 B2 | 10/2006 | Bertness et al. ............ 324/426 | JP | 59-17892 | 1/1984 |
| 7,129,706 B2 | 10/2006 | Kalley ...................... 324/426 | JP | 59-17893 | 1/1984 |
| 7,182,147 B2 | 2/2007 | Cutler et al. ................... 173/1 | JP | 59-17894 | 1/1984 |
| 7,184,905 B2 | 2/2007 | Stefan ........................ 702/63 | JP | 59017894 | 1/1984 |
| 7,200,424 B2 | 4/2007 | Tischer et al. ............. 455/567 | JP | 59215674 | 12/1984 |
| 7,209,860 B2 | 4/2007 | Trsar et al. ................. 702/183 | JP | 60225078 | 11/1985 |
| 7,212,887 B2 | 5/2007 | Shah et al ................. 700/276 | JP | 62-180284 | 8/1987 |
| 7,235,977 B2 | 6/2007 | Koran et al. ................ 324/426 | JP | 63027776 | 2/1988 |
| 7,272,519 B2 | 9/2007 | Lesesky et al. .............. 702/63 | JP | 03274479 | 12/1991 |
| 7,339,477 B2 | 3/2008 | Puzio et al. .............. 340/572.1 | JP | 03282276 | 12/1991 |
| 7,446,536 B2 | 11/2008 | Bertness ................... 324/426 | JP | 4-8636 | 1/1992 |
| 2002/0004694 A1 | 1/2002 | McLeod et al. .............. 701/29 | JP | 04095788 | 3/1992 |
| 2002/0010558 A1 | 1/2002 | Bertness et al. .............. 702/63 | JP | 04131779 | 5/1992 |
| 2002/0041175 A1 | 4/2002 | Lauper et al. ............... 320/106 | JP | 04372536 | 12/1992 |
| 2002/0044050 A1 | 4/2002 | Derbyshire et al. ......... 340/442 | JP | 05211724 A | 8/1993 |
| 2002/0171428 A1 | 11/2002 | Bertness .................... 702/63 | JP | 5216550 | 8/1993 |
| 2002/0176010 A1 | 11/2002 | Wallach et al. ............. 348/362 | JP | 7-128414 | 5/1995 |
| 2003/0009270 A1 | 1/2003 | Breed ....................... 701/29 | JP | 09061505 | 3/1997 |
| 2003/0025481 A1 | 2/2003 | Bertness ................... 324/427 | JP | 10056744 | 2/1998 |
| 2003/0036909 A1 | 2/2003 | Kato ........................ 704/275 | JP | 10232273 | 9/1998 |
| 2003/0038637 A1* | 2/2003 | Bertness et al. ............ 324/426 | JP | 11103503 A | 4/1999 |
| 2003/0040873 A1 | 2/2003 | Lesesky et al. .............. 702/57 | RU | 2089015 C1 | 8/1997 |

| | | |
|---|---|---|
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 97/01103 | 1/1997 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

"Battery Impedance", by E. Willihnganz et al., *Electrical Engineering*, Sep. 1959, pp. 922-925.
"Determining the End of Battery Life", by S. DeBardelaben, *IEEE*, 1986, pp. 365-368.
"A Look at the Impedance of a Cell", by S. Debardelaben, *IEEE*, 1988, pgs. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.
IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2:629.113.006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Wilihncanz, *The Electrochemical Society*, preprint 79-20, Apr. 1941, pp. 253-258.
National Semiconductor Corporation, "High Q Notch Filter", Mar. 1969, Linear Brief 5, Mar. 1969.
Burr-Brown Corporation, "Design A 60 Hz Notch Filter with the UAF42", Jan. 1994, AB-071, 1994.
National Semiconductor Corporation, "LMF90-4$^{th}$-Order Elliptic Notch Filter", Dec. 1994, RRD-B30M115, Dec. 1994.
"Alligator Clips with Wire Penetrators" *J.S. Popper, Inc.* product information, downloaded from http://www.jspopper.com/, undated.
"#12: LM78S40 Simple Switcher DC to DC Converter", *ITM e-Catalog*, downloaded from http://www.pcbcafe.com, undated.
"Simple DC-DC Converts Allows Use of Single Battery", *Electronix Express*, downloaded from http://www.elexp.com/t_dc-dc.htm, undated.
"DC-DC Converter Basics", *Power Designers*, downloaded from http://www.powerdesigners.com/InforWeb.design_center/articles/DC-DC/converter.shtm, undated.
"Notification of Transmittal of the International Search Report or the Declaration", PCT/US02/29461.
"Notification of Transmittal of the International Search Report or the Declaration", PCT/US03/07546.
"Notification of Transmittal of the International Search Report or the Declaration", PCT/US03/06577.
"Notification of Transmittal of the International Search Report or the Declaration", PCT/US03/07837.
"Improved Impedance Spectroscopy Technique for Status Determination of Production Li/SO$_2$ Batteries" Terrill Atwater et al., pp. 10-113, (1992).
"Notification of Transmittal of the International Search Report or the Declaration", PCT/US03/41561.
"Notification of Transmittal of the International Search Report or the Declaration", PCT/US03/27696.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
Supplementary European Search Report Communication for Appl. No. 99917402.2.
"Dynamic modelling of lead/acid batteries using impedance spectroscopy for parameter identification", Journal of Power Sources, pp. 69-84, (1997).
Notification of Transmittal of the International Search Report for PCT/US03/30707.
"A review of impedance measurements for determination of the state-of-charge or state-of-health of secondary batteries", Journal of Power Sources, pp. 59-69, (1998).
"Search Report Under Section 17" for Great Britain Application No. GB0421447.4.
"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.
"Examination Report" from the U.K. Patent Office for U.K. App. No. 0417678.0.
Wikipedia Online Encyclopedia, Inductance, 2005, http://en.wikipedia.org/wiki/inductance, pp. 1-5, mutual Inductance, pp. 3,4.
Young Illustrated Encyclopedia Dictionary of Electronics, 1981, Parker Publishing Company, Inc., pp. 318-319.
Office Action from U.S. Appl. No. 11/352,945; dated Jan. 5, 2007.
Office Action from U.S. Appl. No. 11/146,608 dated May 13, 2008.
Office Action from U.S. Appl. No. 11/063,247 dated Apr. 11, 2008.
"DSP Applications in Hybrid Electric Vehicle Powertrain", Miller et al., Proceedings of the American Control Conference, Sand Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"Notification Concerning Availability of the Publication of the International Application" for PCT/US2008/008702, filed Jul. 17, 2008; 24 pages.
"A Microprocessor-Based Control System for a Near-Term Electric Vehicle", Bimal K. Bose; IEEE Transactions on Industry Applications, vol. IA-17, No. 6, Nov./Dec. 198?,; 0093-9994/81/1100-0626$00.75 © 1981 IEEE, 6 pages.
"First Notice Informing the Applicant of the Communication of the International Application (to Designated Offices which do not apply the 30 Month Time Limit Under Article 22(1))" for PCT/US2008/008702 filed Jul. 17, 2008; one page.
"Notification of the Recording of a Change" for PCT/US2008/008702 filed Jul. 17, 2008; one page.

\* cited by examiner

BATTERY TESTER THAT CALCULATES ITS OWN REFERENCE VALUES

The present application is based on and claims the benefit of U.S. provisional patent application Ser. No. 60/636,270, filed Dec. 14, 2004 and is a Continuation-In-Part of U.S. patent application Ser. No. 11/008,456, filed Dec. 9, 2004, the contents of which are hereby incorporated by reference in their entirety.

BACKGROUND OF THE INVENTION

The present invention relates to testing of storage batteries. More specifically, the present invention relates to a battery tester that calculates its own reference values.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin and Midtronics, Inc. for testing storage batteries by measuring the conductance of the batteries. This technique is described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued Feb. 16, 1999, entitled ANTI-THEFT BATTERY; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Pat. No. 6,737,831, issued May 18, 2004, entitled METHOD AND APPARATUS USING A CIRCUIT MODEL TO EVALUATE CELL/BATTERY PARAMETERS; U.S. Pat. No. 6,744,149, issued Jun. 1, 2004, entitled SYSTEM AND METHOD FOR PROVIDING STEP-DOWN POWER CONVERSION USING AN INTELLIGENT SWITCH; U.S. Pat. No. 6,759,849, issued Jul. 6, 2004, entitled BATTERY TESTER CONFIGURED TO RECEIVE A REMOVABLE DIGITAL MODULE; U.S. Pat. No. 6,781,382, issued Aug. 24, 2004, entitled ELECTRONIC BATTERY TESTER; U.S. Pat. No. 6,788,025, filed Sep. 7, 2004, entitled BATTERY CHARGER WITH BOOSTER PACK; U.S. Pat. No. 6,795,782, issued Sep. 21, 2004, entitled BATTERY TEST MODULE; U.S. Pat. No. 6,805,090, filed Oct. 19, 2004, entitled CHARGE CONTROL SYSTEM FOR A VEHICLE BATTERY; U.S. Pat. No. 6,806,716, filed Oct. 19, 2004, entitled ELECTRONIC BATTERY TESTER; U.S. Pat. No. 6,850,037, filed Feb. 1, 2005, entitled IN-VEHICLE BATTERY MONITORING; U.S. Pat. No. 6,850,037, issued Feb. 1, 2005, entitled IN-VEHICLE BATTERY MONITOR; U.S. Pat. No. 6,871,151, issued march 22, 2005, entitled ELECTRONIC BATTERY TESTER WITH NETWORK COMMUNICATION; U.S. Pat. No. 6,885,195, issued Apr. 26, 2005, entitled METHOD AND APPARATUS FOR AUDITING A BATTERY TEST; U.S. Pat. No. 6,888,468, issued May 3, 2005, entitled APPARATUS AND METHOD FOR PROTECTING A BATTERY FROM OVERDISCHARGE; U.S. Pat. No. 6,891,378, issued May 10, 2005, entitled ELECTRONIC BATTERY TESTER; U.S. Pat. No. 6,906,522, issued Jun. 14, 2005, entitled BATTERY TESTER WITH BATTERY REPLACEMENT OUTPUT; U.S. Pat. No. 6,906,523, issued Jun. 14, 2005, entitled METHOD AND APPARATUS FOR TESTING CELLS AND BATTERIES EMBEDDED IN SERIES/PARALLEL SYSTEMS; U.S. Pat. No. 7,909,287, issued Jun. 21, 2005, entitled ENERGY MANAGEMENT SYSTEM WITH AUTOMOTIVE VEHICLE; U.S. Pat. No. 6,914,413, issued Jul. 5, 2005, entitled ALTERNATOR TESTER WITH ENCODED OUTPUT; U.S. Pat. No. 6,913,483, issued Jul. 5, 2005, entitled CABLE FOR ELECTRONIC BATTERY TESTER; U.S. Pat. No. 6,930,485, issued Aug. 16, 2005, entitled ELECTRONIC BATTERY TESTER WITH BATTERY FAILURE TEMPERATURE DETERMINATION; U.S. Pat. No. 6,933,727, issued Aug. 23, 2005, entitled ELECTRONIC BATTERY TESTER CABLE, U.S. Pat. No. 6,941,234, filed Sep. 6, 2005, entitled QUERY BASED ELECTRONIC BATTERY TESTER; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 09/993,468, filed Nov. 14, 2001, entitled KELVIN CONNECTOR FOR A BATTERY POST; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246,439, filed Sep. 18, 2002, entitled BATTERY TESTER UPGRADE USING SOFTWARE KEY; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; U.S. Ser. No. 10/783,682, filed Feb. 20, 2004, entitled REPLACEABLE CLAMP FOR ELECTRONIC BATTERY TESTER; U.S. Ser. No. 10/791,141, filed Mar. 2, 2004, entitled METHOD AND APPARATUS FOR AUDITING A BATTERY TEST; U.S. Ser. No. 10/823,140, filed Apr. 13, 2004, entitled THEFT PREVENTION DEVICE FOR AUTOMOTIVE VEHICLE SERVICE CENTERS; U.S. Ser. No. 10/864,904, filed Jun. 9, 2004, entitled ALTERNATOR TESTER; U.S. Ser. No. 10/867,385, filed Jun. 14, 2004, entitled ENERGY MANAGEMENT SYSTEM FOR AUTOMOTIVE VEHICLE; U.S. Ser. No. 10/870,680, filed Jun. 17, 2004, entitled ELECTRONIC BATTERY TESTER WITH RELATIVE TEST OUTPUT; U.S. Ser. No. 10/883,019, filed Jul. 1, 2004, entitled MODULAR ELECTRONIC BATTERY TESTER; U.S. Ser. No. 10/896,835, filed Jul. 22, 2004, entitled BROAD-BAND LOW-INDUCTANCE CABLES FOR MAKING KELVIN CONNECTIONS TO ELECTROCHEMICAL CELLS AND BATTERIES; U.S. Ser. No. 10/896,834, filed Jul. 22, 2004, entitled ELECTRONIC BATTERY TESTER; U.S. Ser. No. 10/897,801, filed Jul. 23, 2004, entitled SHUNT CONNECTION TO A PCB FOR AN ENERGY MANAGEMENT SYSTEM EMPLOYED IN AN AUTOMOTIVE VEHICLE; U.S. Ser. No. 10/914,304, filed Aug. 9, 2004, entitled ELECTRONIC BATTERY TESTER WITH NETWORK COMMUNICATION; U.S. Ser. No. 10/958,821, filed Oct. 5, 2004, entitled IN-VEHICLE BATTERY MONITOR; U.S. Ser. No. 10/958,812, filed Oct. 5, 2004, entitled SCAN TOOL FOR ELECTRONIC BATTERY TESTER; U.S. Ser. No. 11/008,456, filed Dec. 9, 2004, entitled APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL, U.S. Ser. No. 60/587,232, filed Dec. 14, 2004, entitled CELLTRON ULTRA, U.S. Ser. No. 11/018,785, filed Dec. 21, 2004, entitled WIRELESS BATTERY MONITOR; U.S. Ser. No. 60/653,537, filed Feb. 16, 2005, entitled CUSTOMER MANAGED WARRANTY CODE; U.S. Ser. No. 11/063,247, filed Feb. 22, 2005, entitled ELECTRONIC BATTERY TESTER OR CHARGER WITH DATABUS CONNECTION; U.S. Ser. No. 60/665,070, filed Mar. 24, 2005, entitled OHMMETER PROTECTION CIRCUIT; U.S. Ser. No. 11/130,600, filed May 17, 2005, entitled QUERY BASED ELECTRONIC BATTERY TESTER; U.S. Ser. No. 11/141,234, filed May 31, 2005, entitled BATTERY TESTER CAPABLE OF IDENTIFYING FAULTY BATTERY POST ADAPTERS; U.S. Ser. No. 11/143,828, filed Jun. 2, 2005, entitled BATTERY TEST MODULE; U.S. Ser. No. 11/146,608, filed Jun. 7, 2005, entitled SCAN TOOL FOR ELECTRONIC BATTERY TESTER; U.S. Ser. No. 60,694,199, filed Jun. 27, 2005, entitled GEL BATTERY CONDUCTANCE COMPENSATION; U.S. Ser. No. 11/178,550, filed Jul. 11, 2005, entitled WIRELESS BATTERY TESTER/CHARGER; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,169, filed Aug. 31, 2005, entitled LOAD TESTER SIMULATION WITH DISCHARGE COMPENSATION, which are incorporated herein in their entirety.

In general, the above testers determine a condition of the battery by measuring at least one battery parameter (such as battery conductance) and comparing the measured value (for example, measured battery conductance) with a reference value (for example, rated battery conductance) for the battery parameter. The rated value(s) are typically manually entered into the battery by a tester user, for example. Relying on the tester user to determine and enter rated values can introduce errors into test results.

SUMMARY OF THE INVENTION

A battery tester that is capable of calculating its own reference values is provided. The battery tester includes test circuitry that is configured to obtain dynamic parameter values for batteries, and to compute at least one reference value based on the dynamic parameter values.

DETAILED DESCRIPTION OF THE PREFERRED EMBODIMENTS

Figure 1:
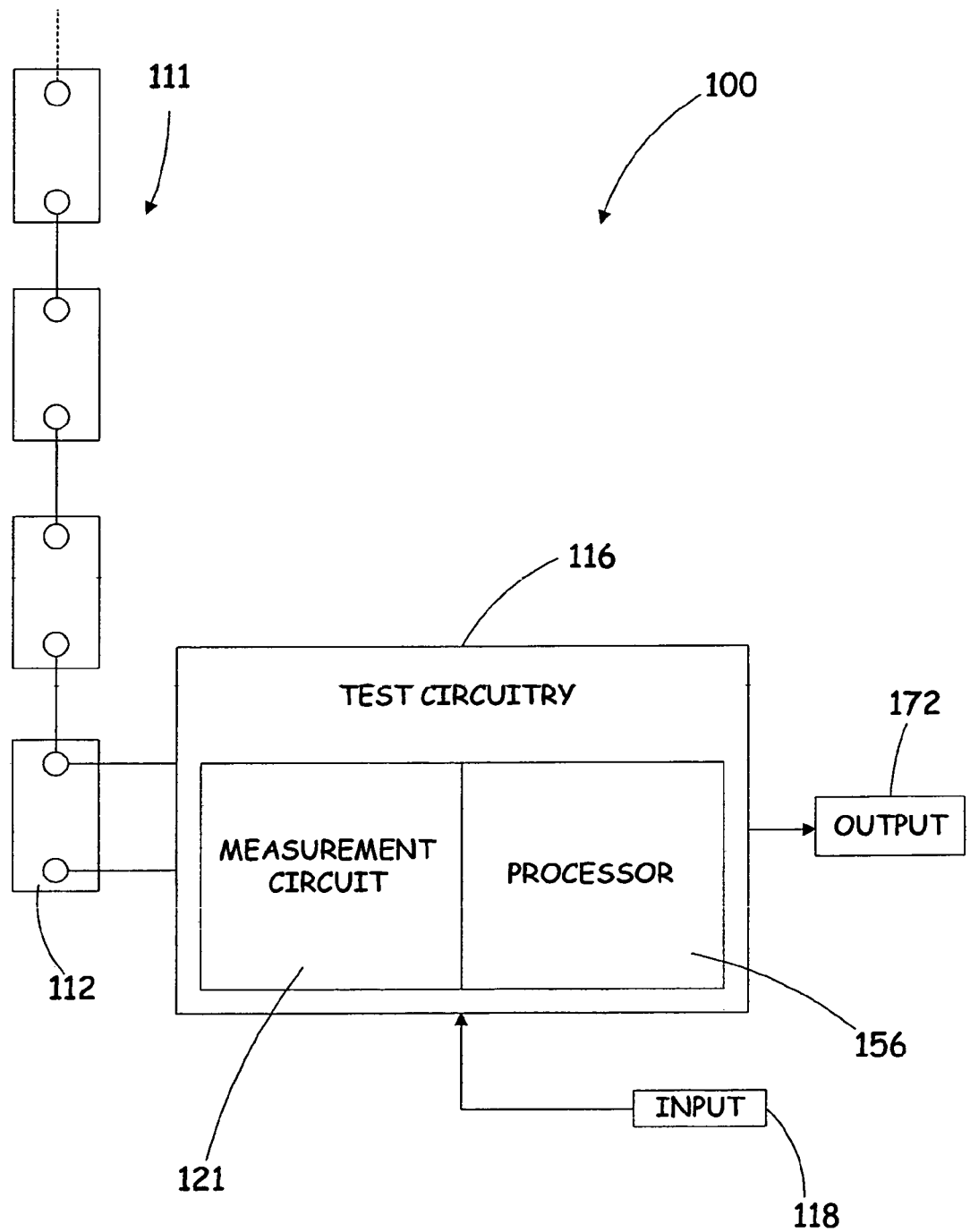
FIG. 1 is a simplified schematic diagram of a battery tester in accordance with an embodiment of the present invention.

FIG. 1 is a very simplified block diagram of a battery tester 100 in accordance with an illustrative embodiment of the present invention. The same reference numerals are used in the various figures to represent the same or similar elements. Battery tester 100 includes test circuitry 116 that electrically couples to a battery 112 of a battery string 111. Test circuitry 116 includes measurement circuit 121 and processor 156. Measurement circuit 121, which operates under the control of processor 156, can be any circuit configuration which is capable of carrying out different battery voltage measurements, current measurements, etc., required to determine reference values and battery test results in accordance with the present invention. In general, as used herein, reference values are average dynamic parameter values (for example, average conductance values) from a sample of "strong" batteries that are similar in condition and age.

In accordance with the present invention, battery tester 100 computes reference values and tests batteries in the string. Battery tester 100 also provides battery condition information based on comparisons between the reference value(s) and the test results. In general, computing differences between test results and reference values help in the determination of the string's capacity to provide enough conductance for the load and can also reflect how a string was treated, installed, or maintained. Although the example embodiments of the present invention described herein relate to carrying out battery conductance measurements to obtain reference values and battery test results, dynamic parameters other than battery conductance may be utilized without departing from the spirit and scope of the invention. Examples of other dynamic parameters include dynamic resistance, admittance, impedance, reactance, susceptance or their combinations.

In some embodiments, reference values are computed based on a selected percentage of batteries in the string. For example, a reference conductance value for batteries in a string can be calculated based only on measured battery conductance values that are not higher or lower than 30% from the average conductance value for the string. These limits are used because conductance values outside this range may not produce a proper reference conductance value needed for carrying out meaningful comparisons. Tester 100 is capable of testing each battery of multiple batteries in battery string 111 one at a time and comparing test results of each battery with the reference value. Tester 100 can also provide condition information for each battery based on the above comparisons. Further, the entire string is analyzed by tester 100 to determine if individual batteries are out of balance in voltage or conductance with respect to the rest of the string. Out of balance batteries are noted by test circuitry 116 and a suitable output is provided to the user via output 172. Although the above discussion regarding tester 100 primarily deals with testing battery strings, it should be noted that tester 100 can also be utilized to test individual batteries that are not a part of a string.

Figure 2:
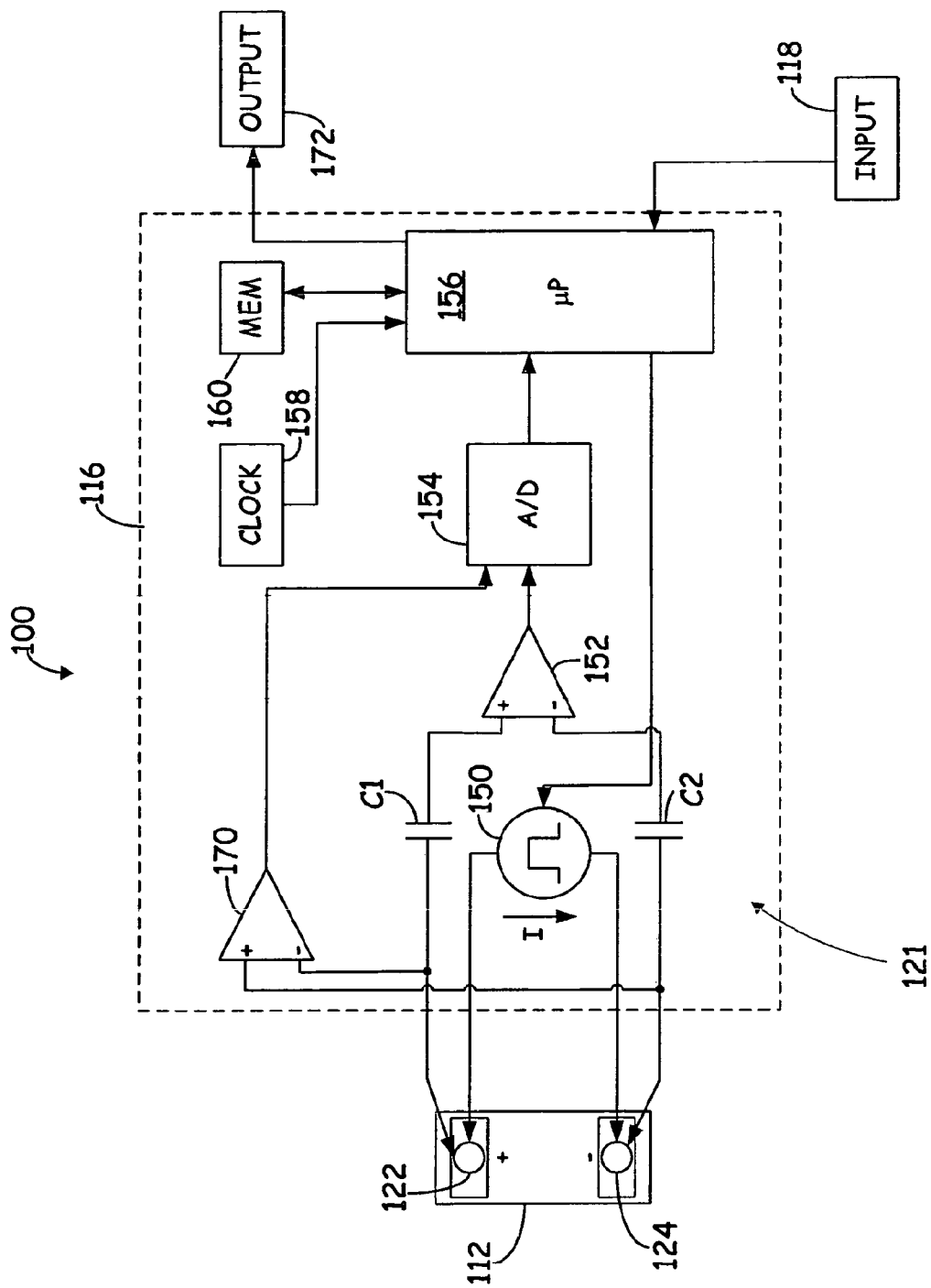
FIG. 2 is a simplified schematic diagram showing battery test circuitry in accordance with an embodiment of the present invention.

FIG. 2 is a more detailed block diagram of battery test circuitry 116, capable of computing the above-mentioned reference values and providing the above-mentioned test results, in accordance with an embodiment of the present invention. As in the case of FIG. 1 above, apparatus 116 is shown coupled to battery 112 (of string 111 (not shown in FIG. 2)), which includes a positive battery terminal 122 and a negative battery terminal 124.

Circuitry 116 operates in accordance with one embodiment of the present invention and determines the conductance (G) of battery 112 and the open circuit voltage (OCV) between terminals 122 and 124 of battery 112. Circuitry 116 includes current source 150, differential amplifier 152, analog-to-digital converter 154 and microprocessor 156. Amplifier 152 is capacitively coupled to battery 112 through capacitors $C_1$ and $C_2$. Amplifier 152 has an output connected to an input of analog-to-digital converter 154. Microprocessor 156 is connected to system clock 158, memory 160 and analog-to-digital converter 154. Microprocessor 156 is also capable of receiving inputs or information from input device 118. Microprocessor 156 also connects to output device 172.

In operation, current source 150 is controlled by microprocessor 156 and provides a current I in the direction shown by the arrow in FIG. 2. In one embodiment, this is a square wave or a pulse. Differential amplifier 152 is connected to terminals 122 and 124 of battery 112 through capacitors $C_1$ and $C_2$, respectively, and provides an output related to the voltage potential difference between terminals 122 and 124. In a preferred embodiment, amplifier 152 has a high input impedance. Circuitry 116 includes differential amplifier 170 having inverting and noninverting inputs connected to terminals 124 and 122, respectively. Amplifier 170 is connected to measure the OCV of battery 112 between terminals 122 and 124. The output of amplifier 170 is provided to analog-to-digital converter 154 such that the voltage across terminals 122 and 124 can be measured by microprocessor 156.

Circuitry 116 is connected to battery 112 through a four-point connection technique known as a Kelvin connection. This Kelvin connection allows current I to be injected into battery 112 through a first pair of terminals while the voltage V across the terminals 122 and 124 is measured by a second pair of connections. Because very little current flows through amplifier 152, the voltage drop across the inputs to amplifier 152 is substantially identical to the voltage drop across terminals 122 and 124 of battery 112. The output of differential amplifier 152 is converted to a digital format and is provided to microprocessor 156. Microprocessor 156 operates at a frequency determined by system clock 158 and in accordance with programming instructions stored in memory 160.

Microprocessor 156 determines the conductance of battery 112 by applying a current pulse I using current source 150. The microprocessor determines the change in battery voltage due to the current pulse I using amplifier 152 and analog-to-digital converter 154. The value of current I generated by current source 150 is known and is stored in memory 160. Microprocessor 156 calculates the conductance (G) (or reciprocally the resistance (R)) of battery 112 using the following equation:

$$\text{Conductance} = G = \frac{\Delta I}{\Delta V} \qquad \text{Equation 1}$$

where ΔI is the change in current flowing through battery 112 due to current source 150 and ΔV is the change in battery voltage due to applied current ΔI. Microprocessor 156 also uses other information input from input device 118 provided by the tester user. This information includes the particular type of battery, the mode of operation (reference value calculation mode or battery test mode), etc.

Under the control of microprocessor 156, test circuitry 116 can test a sample (30, for example) of new or healthy batteries to obtain a conductance value representative of a new online battery (90 days after installation, for example). This reference value is stored in memory 160 and can be used to carry out comparisons with test results from a string, for example. A description of a method embodiment for testing storage batteries in accordance with the present invention is provided below in connection with FIG. 3.

Figure 3:
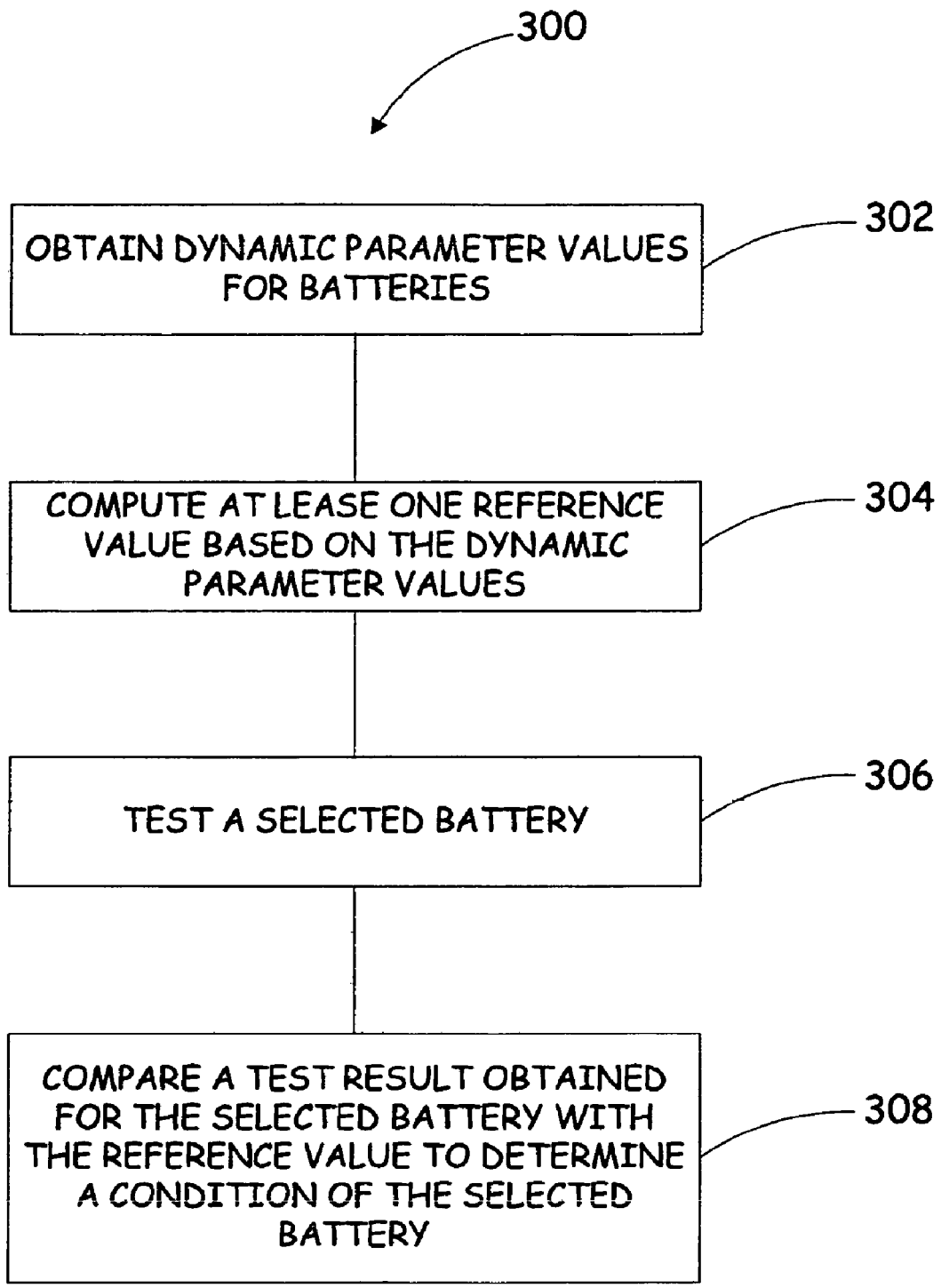
FIG. 3 is a flowchart showing steps of a method of testing a storage battery in accordance with an embodiment of the present invention.

FIG. 3 is a flowchart 300 showing steps of a method of testing storage batteries in accordance with an embodiment of the present invention. At step 302, dynamic parameter values for batteries are obtained. A number of sub-steps may be associated with step 302. In a specific embodiment of the present invention, the sub-steps can include:

Choosing at least 30 batteries from one manufacturer with the same make, model, power rating, age (within 6 months, for example), and service history.
Recording the following information about the batteries:
  Battery manufacturer
  Model number
  Date of manufacture
  Date of installation
  Condition in which the battery operates, such as charge voltage (volts per cell), temperature, and DC current through the battery
  Visible warnings, such as leaking acid, corrosion, or distorted battery cases
Testing one battery, when the batteries are connected in a string, five times in a row on float charge. Here, the conductance results obtained should be within about +2% of each other.
  It should be noted that if the test results do not conform to the above pattern, an electrical signal might be present in the system.
Testing each of the 30 batteries in a manner described above in connection with FIG. 2 to obtain a dynamic parameter value for each battery.

At step 304, at least one reference value is computed based on the dynamic parameter values. This can involve calculating the average conductance of all the batteries. In a specific embodiment, batteries that are higher or lower than 30% from the average conductance of all the batteries are excluded because they might be outside an acceptable (or predetermined) conductance range, and a new average conductance is calculated for the remaining batteries. The new average conductance is used as the reference value. At step 306, a selected battery is tested. At step 308, a test result obtained for the selected battery is compared with the reference value to determine a condition of the selected battery.

It should be noted that, in the above method steps, any user inputs are provided via input 118 and all computations are carried out by, or under the control of, microprocessor 156.

Of course, if a reference value for a string cannot be obtained using the above procedure, a highest conductance value for batteries in the string can also be used as a reference value. Also, a reference value can be input by a user with the help of input 118.

In some embodiments of the present invention, reference values for different models of batteries can be determined as described above and stored in memory 160 in a database. Suitable reference values from memory 160 can be utilized for carrying out comparisons based on the battery models being tested. Existing entries in the database can be modified and/or deleted and new entries can be added to the database.

Figure 4:
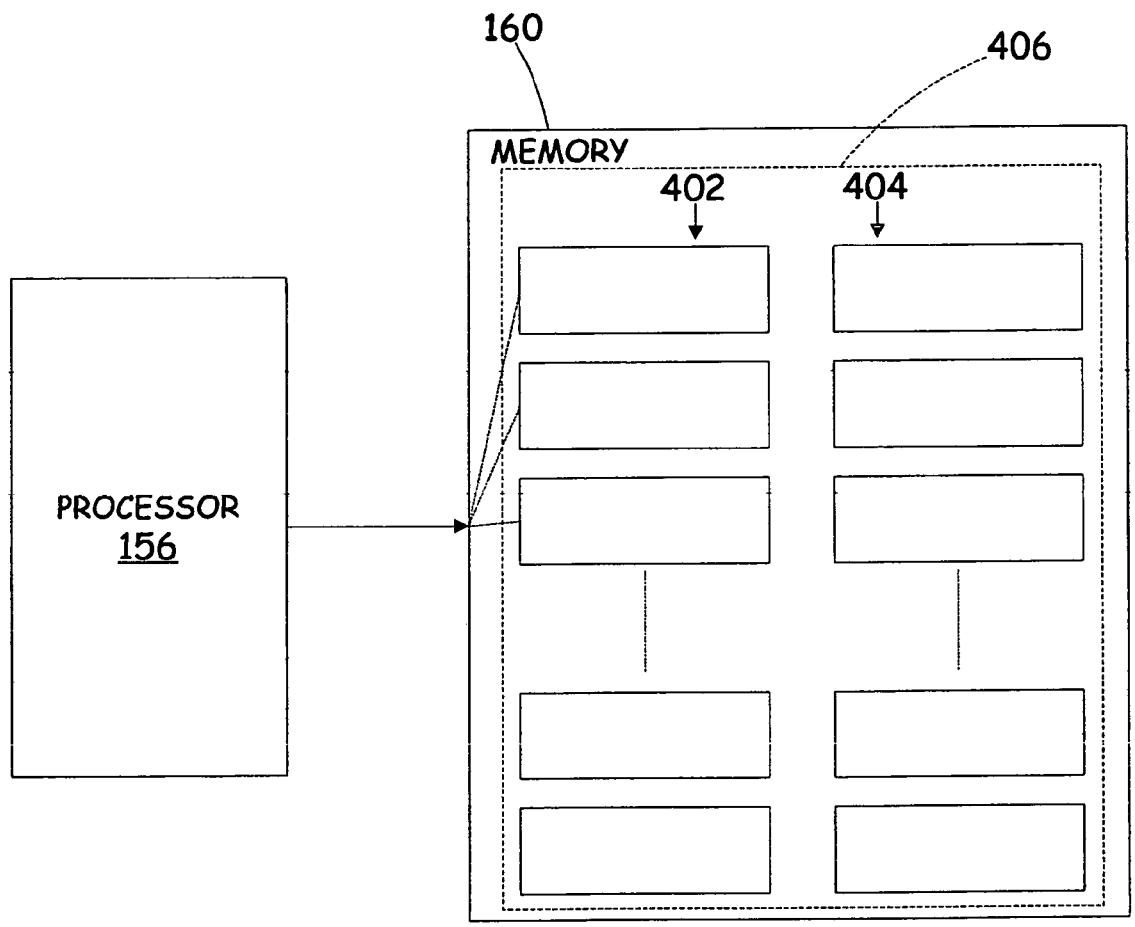
FIG. 4 is a simplified block diagram illustrating a battery tester memory including registers to store battery model codes and corresponding reference values in accordance with an embodiment of the present invention.

FIG. 4 is a simplified block diagram illustrating a battery tester memory including registers to store battery model codes and corresponding reference values in accordance with an embodiment of the present invention. Different battery model numbers/codes can be stored in memory registers 402 and reference values corresponding to the different battery models can be stored in registers 404. Battery model numbers/codes can be received via input device 118 of tester 100 (FIG. 2). Input device 118 can comprise a keyboard input, a bar code scanner, a radio frequency receiver, etc. Microprocessor 156 is configured to suitably update registers 402 in response to receiving model information and also configured to update registers 404 when new reference values are computed. As indicated earlier, information related to model codes, reference values, battery test results, etc., can be organized in the form of a database, in memory 160, in which existing entries can be modified and/or deleted and new entries can be added. Memory locations 402 and 402 can be viewed as constituting two columns of a database 406.

It should be noted that although reference values are primarily described above as being derived from conductance values, reference values can be derived from resistance values, susceptance values, etc., without departing from the scope and spirit of the present invention.

Although the present invention has been described with reference to preferred embodiments, workers skilled in the art will recognize that changes may be made in form and detail without departing from the spirit and scope of the invention.

What is claimed is:
1. A method comprising:
obtaining a plurality of batteries;
obtaining information related to each of the plurality of batteries;
performing at least one battery test on each of the plurality of batteries to obtain at least one test result for each of the plurality of batteries;
associating the at least one test result for each of the plurality of batteries with the corresponding obtained information related to each of the plurality of batteries;

generating a reference value based upon the test results obtained for the plurality of batteries, the reference value is for a specific battery model to which the plurality of batteries belong;

storing the reference value and a battery model code associated with the reference value in a memory;

performing a battery test on another battery, which is not one of the plurality of batteries, but of a same model as each of the plurality of batteries; and providing a battery test output based on a comparison of measurements obtained, during the battery test on the battery that is not one of the plurality of batteries, with the reference value, wherein the test results for the plurality of batteries comprise dynamic parameter values, and wherein the reference value is an average of the dynamic parameter values that fall within a predetermined range of acceptable values, with the dynamic parameter values that fall outside the predetermined range of acceptable values being excluded.

2. The method of claim 1 wherein each of the plurality of batteries is on float charge when the at least one battery test is performed on each of the plurality of batteries.

3. The method of claim 1 wherein performing at least one battery test on each of the plurality of batteries to obtain at least one test result for each of the plurality of batteries comprises performing multiple tests on each of the plurality of batteries to obtain test results for each of the plurality of batteries.

4. The method of claim 3 and further comprising determining whether the test results for each of the plurality of batteries are within a predetermined range of each other.

5. The method of claim 1 wherein the plurality of batteries comprises at least 30 batteries.

6. A battery tester comprising:

battery test circuitry configured to receive information related to each of a plurality of selected batteries;

perform at least one battery test on each of the plurality of batteries to obtain at least one test result for each of the plurality of batteries;

associate the at least one test result for each of the plurality of batteries with the corresponding received information related to each of the plurality of batteries;

generate a reference value based upon the test results obtained for the plurality of batteries, the reference value is for a specific battery model to which the plurality of batteries belong;

store the reference value and a battery model code associated with the reference value in a memory;

perform a battery test on another battery, which is not one of the plurality of batteries, but of a same model as each of the plurality of batteries; and provide a battery test output based on a comparison of measurements obtained, during the battery test on the battery that is not one of the plurality of batteries, with the reference value, wherein the test results for the plurality of batteries comprise dynamic parameter values, and wherein the reference value is an average of the dynamic parameter values that fall within a predetermined range of acceptable values, with the dynamic parameter values that fall outside the predetermined range of acceptable values being excluded.

7. The battery tester of claim 6 wherein the dynamic parameter values are battery conductance values.

8. The battery tester of claim 6 wherein the battery model code is input into the battery tester using one of a keyboard, a barcode scanner and a radio frequency receiver.

9. The batter tester of claim 6 wherein the plurality of batteries comprises at least 30 batteries.

* * * * *